United States Patent
Huynh et al.

(10) Patent No.: US 10,659,175 B2
(45) Date of Patent: May 19, 2020

(54) SYSTEM AND METHOD FOR OVER-THE-AIR (OTA) TESTING TO DETECT FAULTY ELEMENTS IN AN ACTIVE ARRAY ANTENNA OF AN EXTREMELY HIGH FREQUENCY (EHF) WIRELESS COMMUNICATION DEVICE

(71) Applicant: LitePoint Corporation, Sunnyvale, CA (US)

(72) Inventors: Minh-Chau Huynh, San Diego, CA (US); Morten Damgaard, Laguna Hills, CA (US)

(73) Assignee: LITEPOINT CORPORATION, San Jose, CA (US)

( * ) Notice: Subject to any disclaimer, the term of this patent is extended or adjusted under 35 U.S.C. 154(b) by 0 days.

(21) Appl. No.: 16/036,522

(22) Filed: Jul. 16, 2018

(65) Prior Publication Data
US 2020/0021370 A1  Jan. 16, 2020

(51) Int. Cl.
*H04B 17/00* (2015.01)
*H04B 17/10* (2015.01)
(Continued)

(52) U.S. Cl.
CPC ........... *H04B 17/102* (2015.01); *G01R 29/10* (2013.01); *H01Q 3/267* (2013.01); *H04B 17/17* (2015.01); *H04B 17/391* (2015.01)

(58) Field of Classification Search
CPC .... H04B 17/102; H04B 17/17; H04B 17/391; H01Q 3/267; G01R 29/10
See application file for complete search history.

(56) References Cited

U.S. PATENT DOCUMENTS

| | | | |
|---|---|---|---|
| 2005/0110696 A1 | 5/2005 | Surducan et al. | 343/795 |
| 2007/0222696 A1 | 9/2007 | Wikstrom | 343/797 |

(Continued)

OTHER PUBLICATIONS

PCT International Search Report and Written Opinion Action issued in corresponding foreign application, PCT/US19/41893, pp. 1-8 (dated Nov. 6, 2019).

(Continued)

*Primary Examiner* — Nhan T Le
(74) *Attorney, Agent, or Firm* — Rosenbaum IP, P.C.

(57) ABSTRACT

Systems and methods for detecting faulty elements in an active planar antenna array of an extremely high frequency (EHF) wireless communication device. A planar antenna array having a matrix of dual-polarization modulated scattering probes is disposed within a near-field region of the antenna under test (AUT). Electromagnetic energy received from the AUT is converted to a complex electrical signal that is modulated by an electrical modulation signal and radiated as a scattering signal. The resulting electromagnetic scattering signal, received and converted to an electrical signal by another antenna, is used in a holographic image reconstruction operation via a backward-propagation transformation to reconstruct the signal spectrum radiated from the surface of the AUT. A comparison of this reconstructed signal spectrum with a reference signal spectrum radiated from the surface of a known good antenna array enables detection of faulty antenna elements within the AUT.

16 Claims, 11 Drawing Sheets

(51) Int. Cl.
    *G01R 29/10*     (2006.01)
    *H04B 17/391*     (2015.01)
    *H04B 17/17*     (2015.01)
    *H01Q 3/26*     (2006.01)

(56) References Cited

U.S. PATENT DOCUMENTS

| | | | |
|---|---|---|---|
| 2010/0097048 A1 | 4/2010 | Werner et al. | 324/76.11 |
| 2011/0006310 A1* | 1/2011 | Nagasawa | H01L 29/045 |
| | | | 257/77 |
| 2013/0180763 A1* | 7/2013 | Moul | H01P 3/088 |
| | | | 174/251 |
| 2014/0179239 A1 | 6/2014 | Nickel et al. | H04W 24/00 |
| 2018/0233808 A1* | 8/2018 | Noori | H01Q 1/2258 |

OTHER PUBLICATIONS

Qian Chen et al. Simultaneous Electromagnetic Measurement Using a Parallel Modulated Probe Array. IEEE Transactions on Electromagnetic Compatibility. May 2007, vol. 49, Issue 2, pp. 263-269.

* cited by examiner

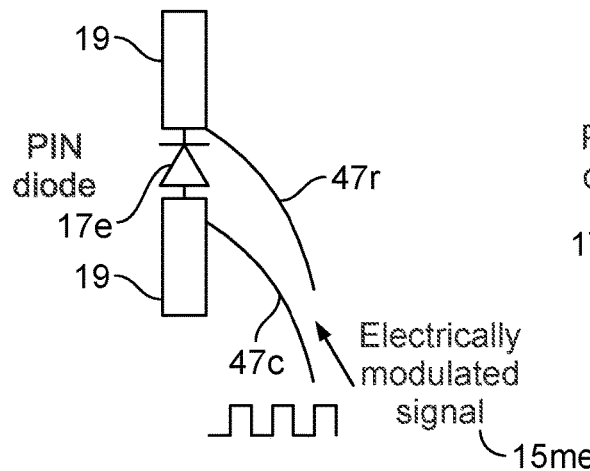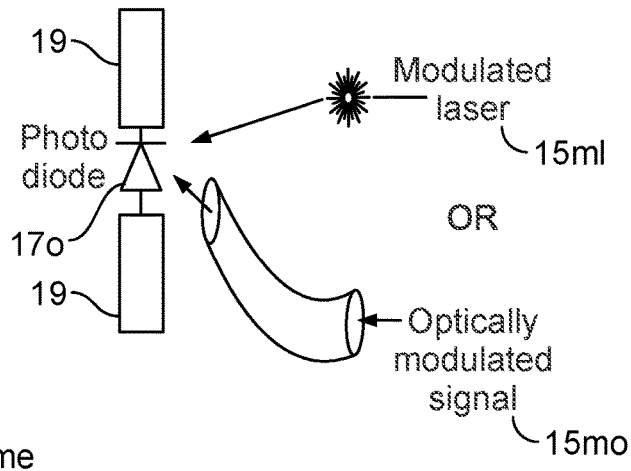
FIG. 8A  FIG. 8B
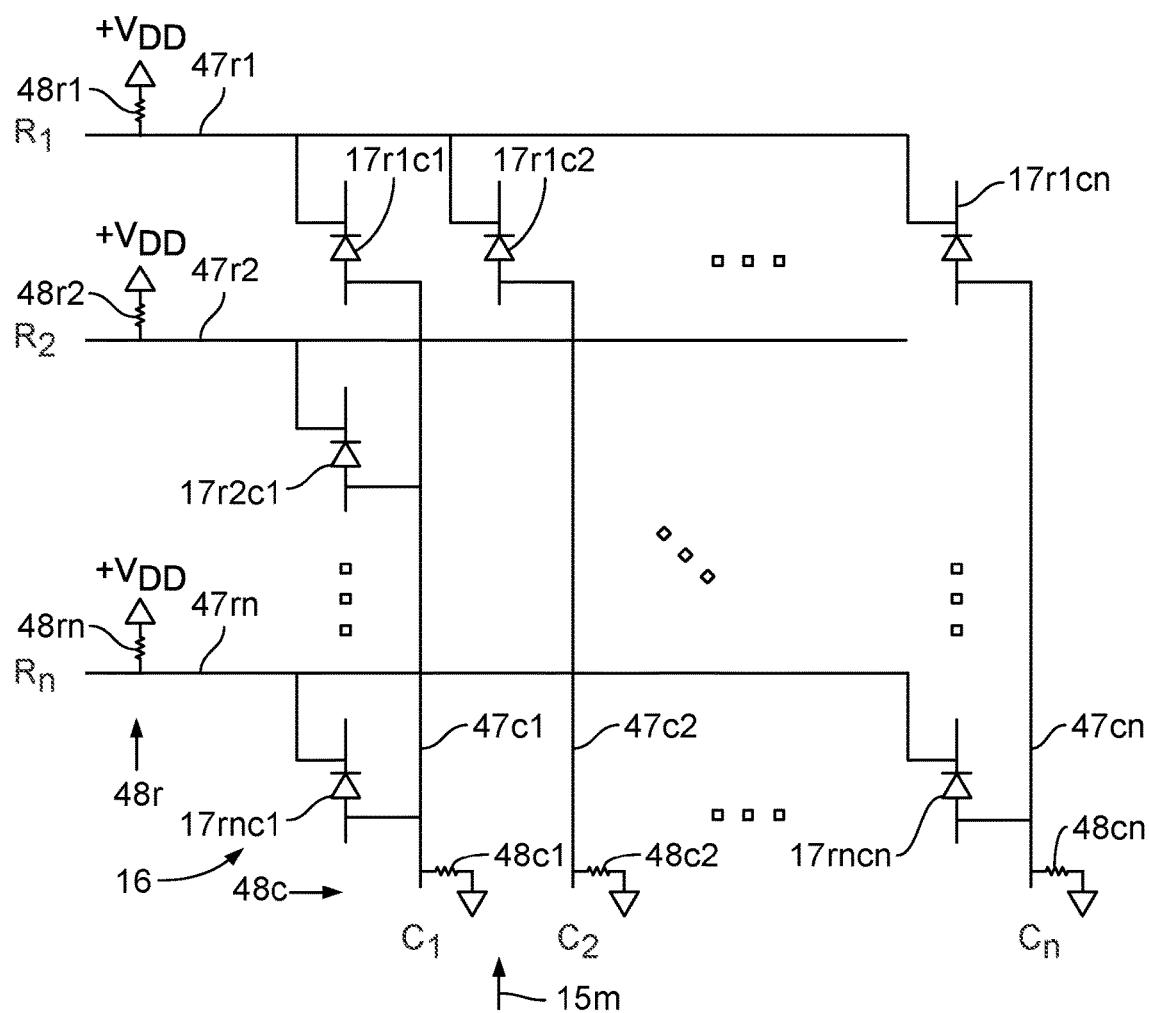
FIG. 9

SYSTEM AND METHOD FOR OVER-THE-AIR (OTA) TESTING TO DETECT FAULTY ELEMENTS IN AN ACTIVE ARRAY ANTENNA OF AN EXTREMELY HIGH FREQUENCY (EHF) WIRELESS COMMUNICATION DEVICE

BACKGROUND

The present invention relates to over-the-air (OTA) testing of radio frequency transceiver systems, and in particular to testing to detect faulty elements in an active antenna array of an extremely high frequency (EHF) wireless communication device.

As mobile wireless communication devices have become more widely used for many purposes, availability of sufficient signal bandwidth to accommodate the many varied uses (e.g., streaming of video and/or more uses of video in two-way communications in particular), has become a critical issue. This has led to more use of higher signal frequencies, such as extremely high frequency (EHF), which is the International Telecommunication Union (ITU) designation for radio frequencies in the electromagnetic spectrum band of 30-300 gigahertz (GHz), in which radio waves have wavelengths of 10-1 millimeter, and are often referred to as millimeter wave (mmW) signals.

For various reasons, including short line-of-sight signal paths due to high atmospheric attenuation, such devices often use active array antennas to beamform the signals to maximize signal path lengths (as well as to better enable frequency reuse). As is known in the art, such antenna structures include multiple active antenna elements, typically arranged in a regular array, e.g., a rectangular array of 16 or 25 antenna elements (for radiation and reception of respective electromagnetic signals) disposed in a 4×4 or 5×5 array, respectively. Accordingly, when testing such devices, it is important to be able to test each of the active antenna elements (e.g., all 16 or 25 antenna elements for a 4×4 or 5×5 array, respectively) to ensure compliance of the device to its design and/or performance specifications.

Current conventional testing techniques include performing far-field, compact range and near-field measurements of radiated energy from the active antenna elements. The far-field method is often used for testing performance of antennas that are generally used for communication between two devices that are far apart, e.g., several λ apart (where λ is the wavelength of the carrier frequency of the radiated signal). With this method, the receiver, or range. antenna and the antenna under test (AUT) are separated by a range distance R of at least $R=2D^2/\lambda$ apart from each other (where D is largest aperture dimension of the two antennas). For an antenna with a large aperture (e.g., several wavelengths in size), the range distance R can be large and dimensions of the shielded test chamber using such a method will be large. Hence, A test system using a far-field test method is undesirable for use in a manufacturing environment due to its size.

Further, while a far-field method may enable measuring of overall antenna performance and capturing the antenna radiation pattern, it cannot reliably detect defective elements in an antenna array since no reasonably detectable radiation difference would be observed when measuring a fully active array with a minority of defective elements (e.g., a 5×5 element array with three of the 25 elements being defective). For example, using a single-point measurement of radiated energy steered in a broadside direction from such an antenna array does not reveal a significant difference (<1 dB) from that measured from an antenna array having no defective elements. Moreover, even if such a small difference can be reasonably detected and measured, neither the number nor identities of the defective elements will be known, and even with no significant difference in measured performances of an antenna array with defective elements when steering at broadside, performance degradation may show up at other steering angles.

The compact range method, though similar in some respects to the far-field method, differs in that an apparatus is used to transform a spherical wave into planar wave within a near-field region of the AUT, e.g., by using a reflector with a complex shape designed for such purpose. However, while the compact range method helps decrease the size of the required testing envelope (as well as the shielded test chamber), like the direct far-field method, this method still cannot detect and identify faulty elements in an array in full active mode of operation.

Meanwhile, conventional near-field methods include near-field measurements that capture complex signals using planar, cylindrical or spherical scans, and simple coupling techniques that capture power magnitude only. Near-field capturing of complex signals, generally in the radiating near-field region, advantageously includes complex data that can be mathematically transformed out to the far-field region to obtain far-field performance characteristics or transformed back to the antenna surface to help perform antenna diagnostics. While such systems also have smaller footprints than direct far-field and compact range systems, they generally use a single probe to perform a measurement scan using a robot arm and, therefore, involve long test times to obtain measured data within the tested scanning surface (e.g., planar, cylindrical or spherical). While an electronic switched electronic array may be used in place of a mechanical device to accelerate the measurement scan, when a large scan is needed the necessary large switch array and design can be complex and expensive.

Simple near-field coupling techniques that capture power magnitude only, which tend to be simple and low cost and often used in manufacturing environments, use a coupler, or antenna, placed near the AUT to capture the radiated power. A comparison power test with a measured power from a reference, or known good, AUT is used to validate whether the AUT is defective or not. In order to capture all potential defects, the aperture of the coupler needs to be as large as the AUT. For a small (e.g., 2×2) array, detecting which element is defective is not critical so long as it can be determined whether the array as a whole is defective or not. However, for an AUT with a large number of elements, design of a large coupler, essentially an antenna with a very large aperture, though complex, is needed since near fields of all the elements must be measured to ensure accurate detection(s) of defective array elements. Further, such coupling method cannot identify individual defective elements in a large array when under normal operation (fully active array). While such coupling method may nonetheless be used to test on an individual element-by-element basis to detect individual faulty elements, this becomes increasingly time intensive and still does not enable testing of the array under normal (fully active) operation.

SUMMARY

Systems and methods are provided for detecting faulty elements in an active planar antenna array of an extremely high frequency (EHF) wireless communication device. A planar antenna array having a matrix of dual-polarization modulated scattering probes is disposed within a near-field region of the antenna under test (AUT). Electromagnetic energy received from the AUT is converted to a complex electrical signal that is modulated by an electrical modulation signal and radiated as a scattering signal. The resulting electromagnetic scattering signal, received and converted to an electrical signal by another antenna, is used in a holographic image reconstruction operation via a backward-propagation transformation to reconstruct the signal spectrum radiated from the surface of the AUT. A comparison of this reconstructed signal spectrum with a reference signal spectrum radiated from the surface of a known good antenna array enables detection of faulty antenna elements within the AUT.

In accordance with an exemplary embodiment, an active modulated scattering probe array includes: a circuit board structure having a plurality of layers, wherein the plurality of layers include alternating planar layers of electrical conductors and at least one dielectric; a first plurality of probe antenna elements disposed with a first common orientation in a first array in a first one of the plurality of layers; a first plurality of electrical signal modulation devices connected among the first plurality of probe antenna elements and disposed in a second one of the plurality of layers; and a first plurality of electrical impedances connected among the first plurality of electrical signal modulation devices and disposed in the second one of the plurality of layers.

In accordance with another exemplary embodiment, a method for operating an active modulated scattering probe array includes: providing a circuit board structure having a plurality of layers, wherein the plurality of layers include alternating planar layers of electrical conductors and at least one dielectric; providing a first plurality of probe antenna elements disposed with a first common orientation in a first array in a first one of the plurality of layers; providing a first plurality of electrical signal modulation devices disposed in a second one of the plurality of layers and connected among the first plurality of probe antenna elements; and providing a first plurality of electrical impedances disposed in the second one of the plurality of layers and connected among the first plurality of electrical signal modulation devices.

BRIEF DESCRIPTION OF THE DRAWINGS

FIGS. 8A and 8B depict exemplary uses of diodes as modulation devices of a modulated scattering probe array near-field scanner in accordance with exemplary embodiments.

FIG. 9 depicts a matrix configuration for providing electrical driving signals for modulation devices of a modulated scattering probe array near-field scanner in accordance with exemplary embodiments.

DETAILED DESCRIPTION

Figure 1:
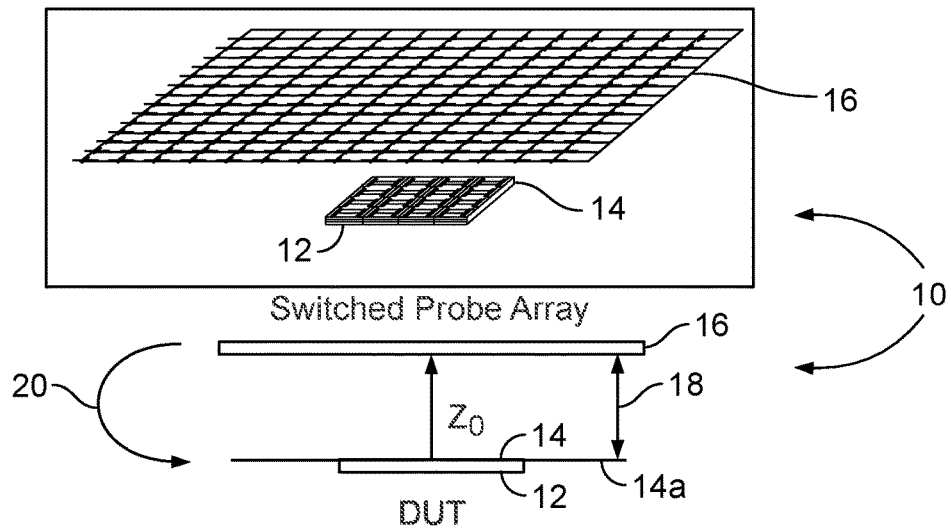
FIG. 1 depicts a switched probe array disposed proximate a DUT for testing in accordance with exemplary embodiments.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

As discussed in more detail below, a test system with a small physical footprint may be designed to perform high speed measurement scans on a device under test (DUT) during which all elements of its antenna array operate in fully active modes (e.g., with all, or a desired subset, of the elements being excited simultaneously), as opposed to performing measurement scans on an element-by-element basis. Such testing may be more advantageous when performed with a planar array antenna built above ground as essentially a directional antenna with a large aperture, as a planar scan is generally more appropriate than a cylindrical or spherical scan.

As also discussed in more detail below, such testing technique may be used to detect defective antenna elements in an array by performing a holographic image reconstruction of the electric fields (E-fields) at the surface of the DUT antenna array using a backward-propagation transform of the measured complex fields on a planar scan surface in the near-field region of the antenna under test (AUT), e.g., with the test antenna array located at a distance of at least one wavelength ($1\lambda$) from the AUT to minimize perturbation on its radiated energy performance characteristics. The measured scanned E-fields received from the AUT may be compared with previously measured scanned E-fields received from a reference antenna array (RA) (e.g., a known good DUT with a similar antenna array). Differences between the scanned fields of the AUT and RA can be used to determine whether and where defective antenna elements are located within the AUT based on the backward-propagation transformation.

More particularly, as discussed in more detail below, a large switched array may be used to capture the near-fields of the energy received from the AUT of the DUT. Such an array may include small probe antennas using a modulated scattering technique, as opposed to conventional probe antennas. Further, such an array may also be used as a re-configurable coupler, where the array searches and uses a subset of its probes that capture near-fields with predetermined minimum power levels and perform a summation of the received power levels to compute a single power value for comparison with that of a reference DUT. Such a method may work well for small DUT arrays where, for purposes of the desired test, determining simply whether the DUT is defective or not is sufficient and knowing locations of defects is unnecessary.

Referring to FIG. 1, as introduced above and in accordance with exemplary embodiments, a DUT 12 having a planar antenna array 14 is tested in a wireless test environment (e.g., within an electromagnetically shielded enclosure forming, in accordance with known techniques, an anechoic chamber designed for the signal frequencies being tested) in which the radiating and receiving antenna elements of the antenna array 14 define an AUT plane 14*a*. A modulated-scattering probe array 16 (also planar) defines a plane disposed within the near-field region $Z_O$ of the AUT 14 at a distance 18 of at least one wavelength (e.g., in terms of the nominal carrier frequency of the signals of interest). As discussed in more detail below, complex near-field signals from each probe of the modulated-scattering probe array 16 (e.g., designed to have dual polarizations along orthogonal axes x, y of the of the array 16, thereby enabling measurements of both magnitudes and phases) are received by a test antenna (not shown) and measured, with the results then used to perform a backward-propagation transformation 20.

Figure 2:
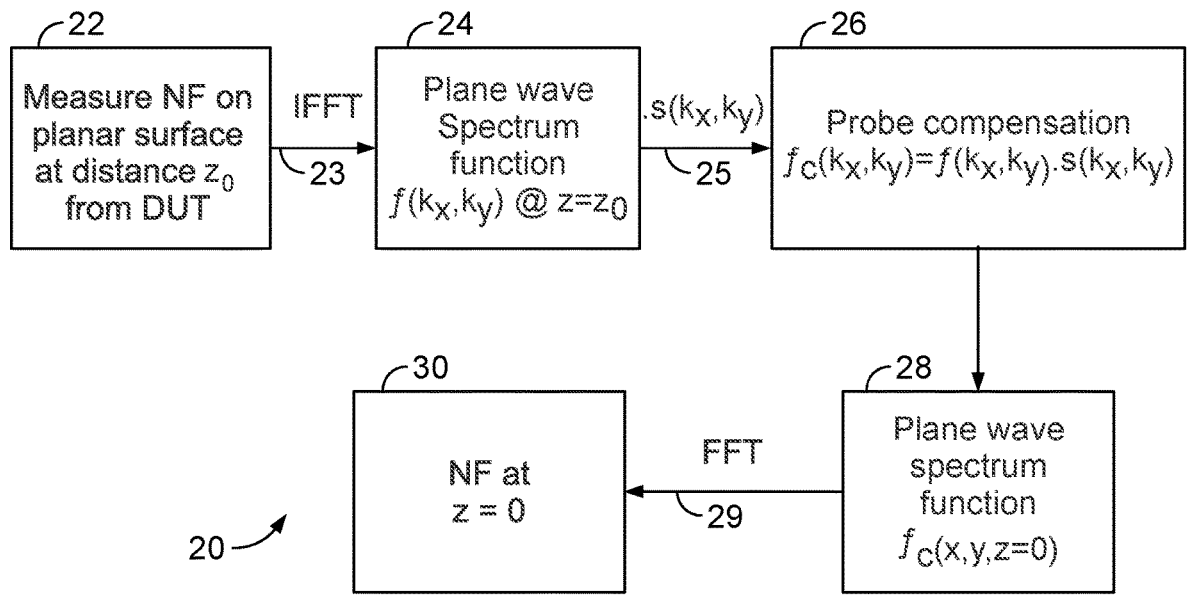
FIG. 2 depicts implementation of a holographic image reconstruction via backward-propagation transformation technique in accordance with exemplary embodiments.

Referring to FIG. 2, in accordance with exemplary embodiments, a backward-propagation transformation 20 (various forms of which are known in the art) operates on the measured complex near-field signals first by measuring 22 near-field energy at the planar surface of probe array 16 at the distance $Z_O$ from the AUT 14 of the DUT 12. The measured energy is then processed in accordance with an Inverse Fast Fourier Transform (IFFT) 23 to produce a plane wave spectrum function 24 representing the received energy at each probe of the probe array 16. From this spectrum function respective probe compensation parameters are computed 25 to provide probe compensation 26 for each probe of the probe array 16. These probe compensation parameters 26 are applied to the plane wave spectrum function 24 to compute a corresponding compensated plane wave spectrum function 28, that is then processed in accordance with a Fast Fourier Transform (FFT) 29 to determine the near-field energy 30 radiated from the AUT 14.

Figure 3:
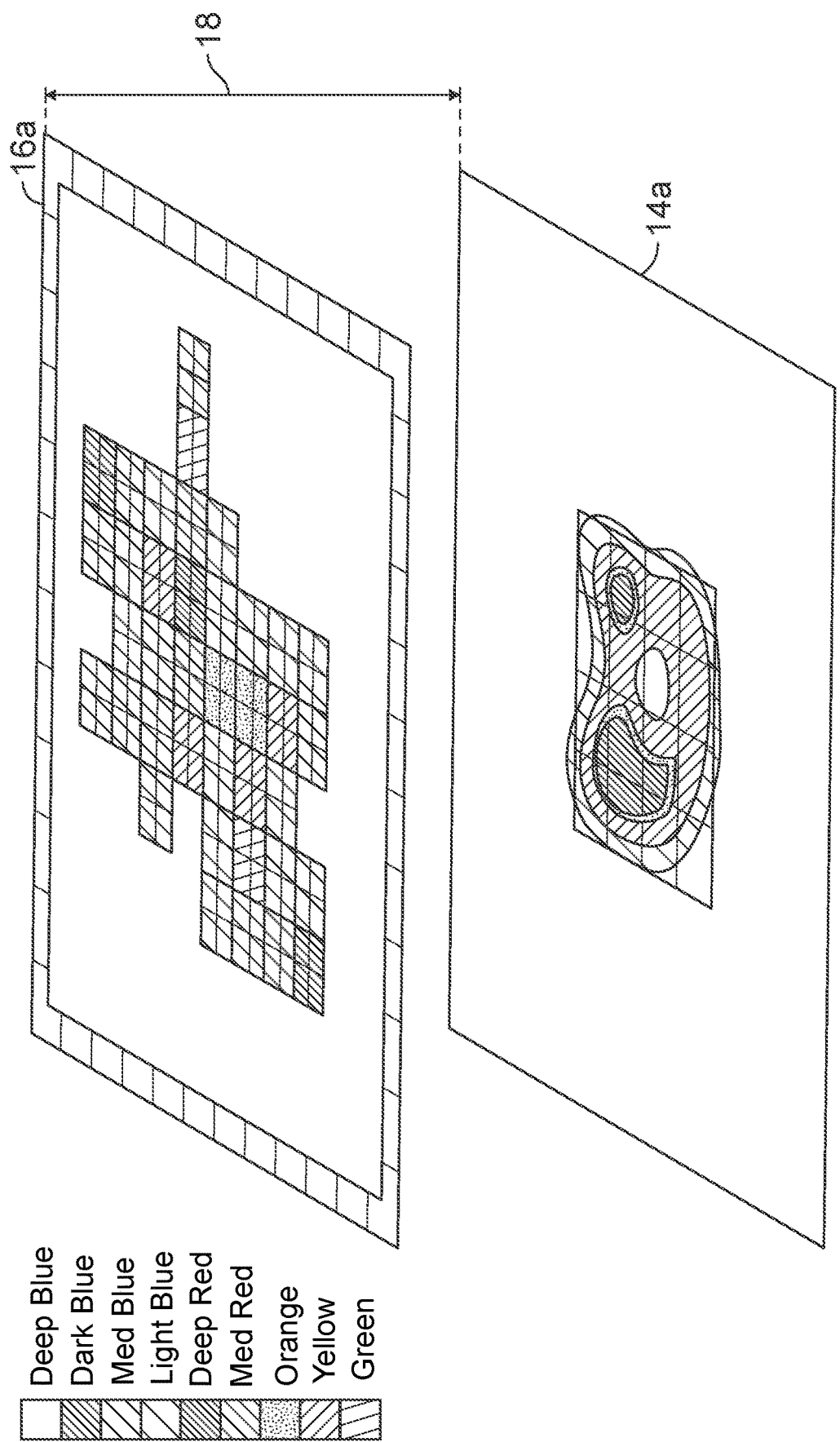
FIG. 3 depicts capturing radiated near fields within a near-field region of an AUT transformed back to the plane of the AUT in accordance with exemplary embodiments.

Referring to FIG. 3, in an exemplary hypothetical test scenario, an AUT 14 having a 4×4 array of 16 antenna elements (e.g., capacitive patch elements) defining the z=0 plane 14*a* may be radiating its signal energy such that maximum energy will be emitted from the regions shaded more darkly red, minimum energy emitted from the regions shaded more darkly blue, and intermediate energy emitted from the regions shaded green and yellow. Similarly, the corresponding signal energy received by a probe array 16 having a 12×12 array of 144 dual-polarized elements (defining the $Z=Z_O$ plane 16*a*) has various energy levels indicated by variously shaded regions as discussed above.

Figure 4:
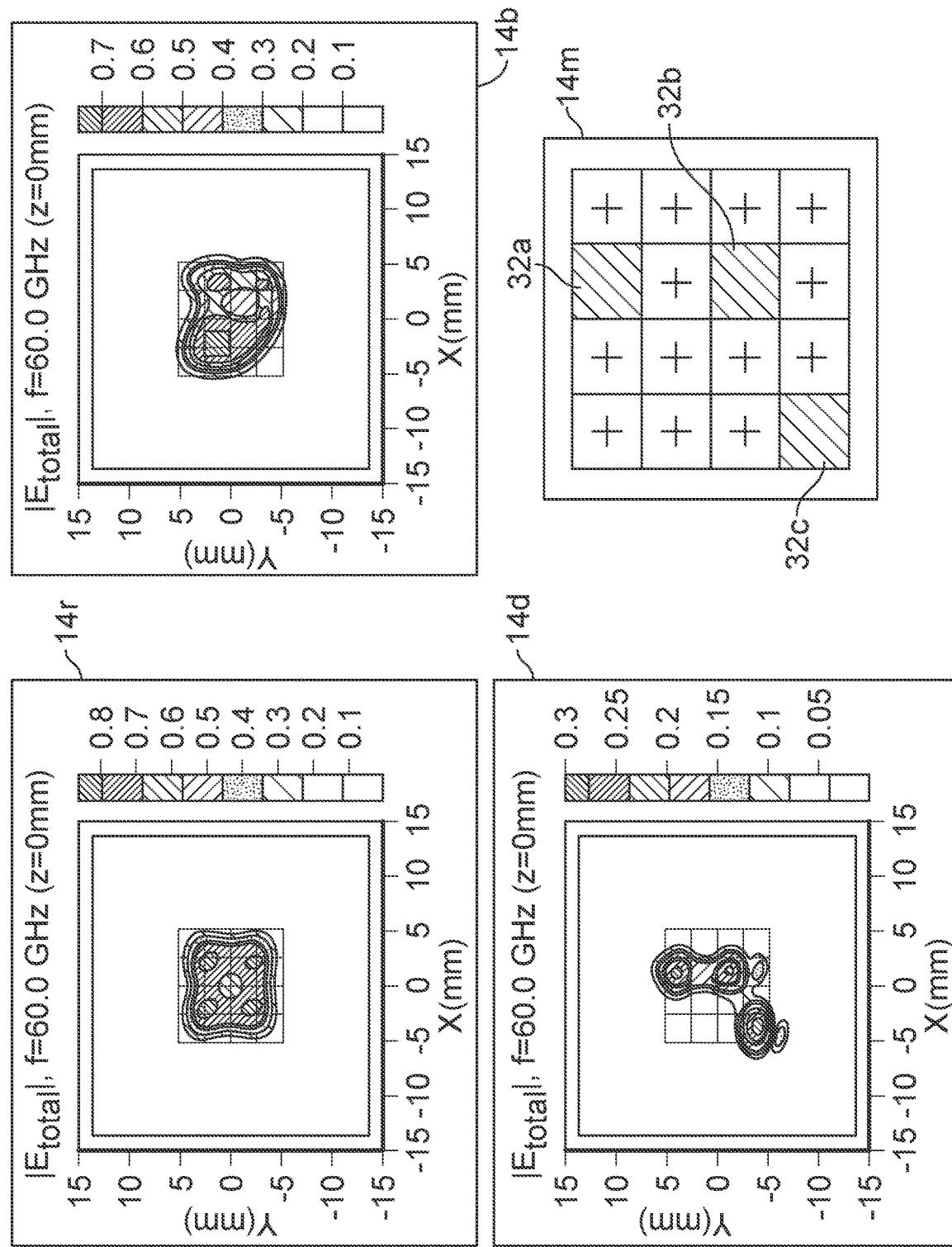
FIG. 4 depicts results of a differential holographic backward-propagation transformation in accordance with exemplary embodiments.

Referring to FIG. 4, a holographic image reconstruction in accordance with exemplary embodiments may use transformed near-field magnitudes at the surface of an AUT 14 (e.g., a 4×4 antenna array) after transforming the complex field difference captured at the scan surface 16*a* one wavelength away from the AUT 14. For example, measured and back-transformed energy levels 14*r* of a reference (e.g., known good) AUT may be compared to measured and back-transformed energy levels 14*b* of a faulty AUT (with various energy levels indicated by variously shaded regions as discussed above) to produce a transform of the complex near-field difference between the reference array 14*r* and AUT 14*b* to indicate a faulty AUT 14*m* having faulty antenna elements 32*a*, 32*b*, 32*c*.

In other words, testing a fully-active AUT to identify potential defects may be described as follows. (As will be readily understood by one of ordinary skill in the art, even if an array antenna element is identified as defective, it may still be possible (albeit perhaps only slightly) that it is not defective but instead circuitry and/or connections within the DUT responsible for driving such identified array antenna element is/are defective. However, other electrical signal testing of such circuitry and/or connections earlier in the manufacturing process can minimize likelihood of such non-antenna defects.)

First, perform measurements of complex near-fields (magnitude and phase) using the probe array 16 at the prescribed distance $Z_O$ of at least one wavelength from a reference (e.g., a known good) DUT operating in fully active mode. Such measurements will form a reference surface scan matrix 14*r* MREF for Z=0. Second, perform measurements of complex near-fields at the same distance $Z_0$ and same reference AUT position $Z=0$ for a DUT operating in fully active mode to form a measured surface scan 14*b* MAUT for $Z=Z_0$. Third, perform individual subtraction of the two matrices MREF ($Z=Z_0$)–MAUT ($Z=Z_0$)=MS ($Z=Z_0$) and transform the differential matrix MS down to $Z=Z_0$ at the array antenna surface MS($Z=0$) 14*d*. The absolute value of the differential matrix |MS ($Z=0$)| shows the difference in E-field magnitudes 14*d* at the surface of the AUT ($Z=0$) between the reference array results 14*r* and AUT results 14*b*. This test may be executed for any fully-active array state. For example, the array testing state may be set at a specific beamforming angle. If an element of the AUT under test does not have the same phase delay or field magnitude as in the reference array, the difference E-field at $Z=0$ will appear at the location of the defective element.

Figure 5:
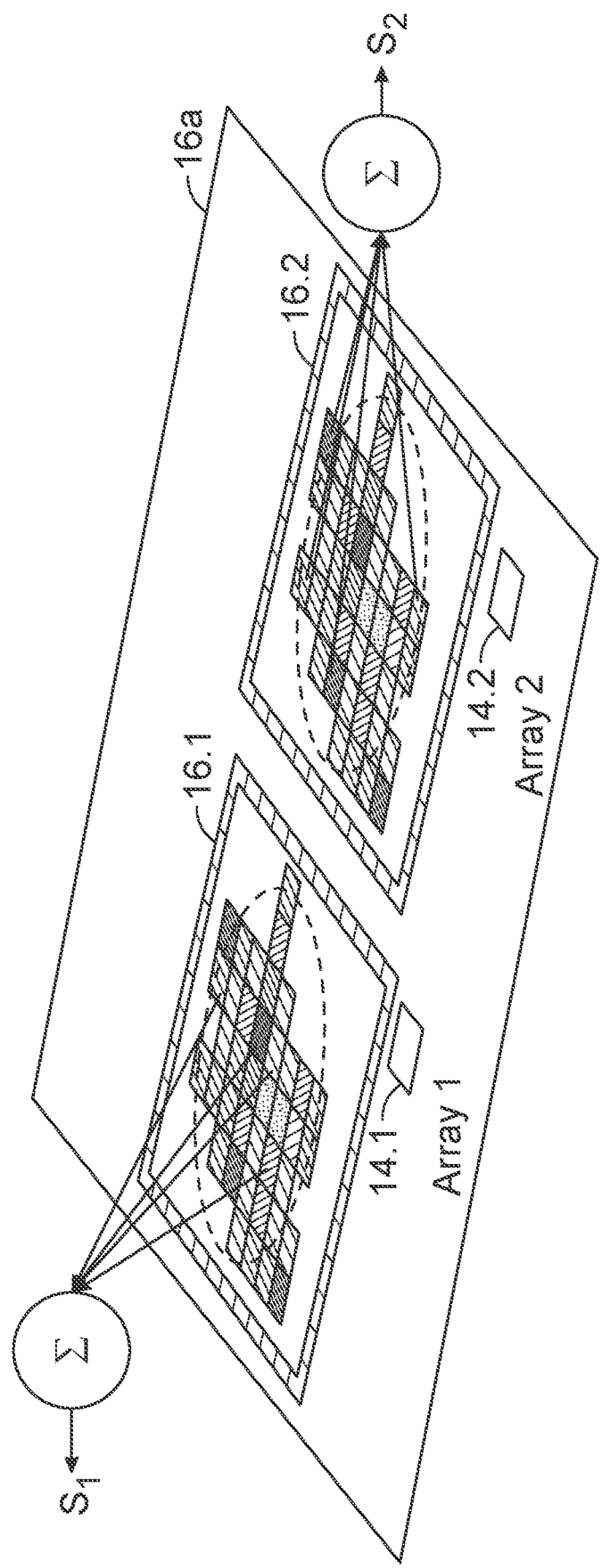
FIG. 5 depicts use of a switched probe array for re-configurable multiple-coupling testing of multiple AUTs in accordance with exemplary embodiments.

Referring to FIG. 5, similar testing may be done for multiple arrays or multiple subsets of a larger array. For example, measured near-field data from the scan surface ($Z=Z_0$) can be used to perform data processing to test the arrays. A user may define a scan area for each array, or a full scan may be performed to detect probes within the probe array demonstrating significant near-field signal strengths with such probes then used to define desired scan areas. This may enable the user to create re-configurable sub-apertures within a larger array aperture using the large switched probe array 16. This may be particularly useful when the AUT is small (e.g., a 2×2 array) and there is no significant advantage (or perhaps even need) to know which element may be defective. (This may also be seen as similar to a coupling method using a single antenna to capture radiated signals from the AUT.) All measured complex near-field values from each probe of the modulated-scattering switched probe array within the chosen sub-aperture can be summed to give a single measured value, which may be compared to that of a reference array to test whether the AUT is defective (e.g., containing at least one faulty element).

Figure 6A:
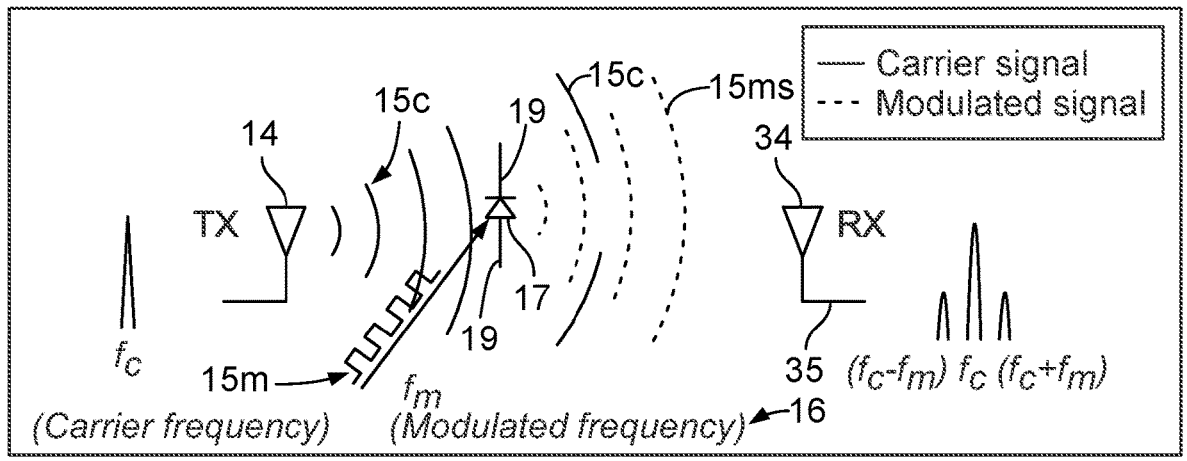
FIG. 6A depicts application of a modulation signal to an active switched probe array to produce modulated scattering signals in accordance with exemplary embodiments.

Referring to FIG. 6A, use of a modulated-scattering probe array in place of a conventional probe antenna enables reductions in complexities of a switched array design for capturing near fields at a specified scanning plane surface. As known in the art, modulated scattering may be achieved with a frequency mixer over the air using a scattering object (e.g., an electrical conductor) 19 connected to a non-linear circuit component (e.g., a diode) 17 driven by a modulating signal 15*m* having a modulation frequency $f_M$. When the scattering object 19 also receives an incoming radiated signal 15*c* having a carrier frequency $f_C$ from a transmitter, frequency mixing occurs within the non-linear circuit component 17, thereby producing modulation sidebands having lower $f_L$ and upper $f_U$ sideband frequencies below and above the carrier frequency $f_C$, respectively.

The resulting re-emitted electromagnetic signals 15*c*, 15*ms* together include the carrier frequency $f_C$ along with the modulation sidebands having lower $f_C-f_M$ and upper $f_C+f_M$ sideband frequencies, and may be captured by a test receiving antenna 34 for conversion to a radio frequency (RF) electrical signal 35. The signal components at the lower $f_C-f_M$ and upper $f_C+f_M$ sideband frequencies contain all necessary electromagnetic information from the radiated signal wave hitting the scattering object 19 (e.g., amplitude and phase) that are needed for purposes of the backward propagation transformation discussed above. (As will be readily appreciated by one skilled in the art, if the modulation signal 15*m* is non-linear (e.g., a square wave) then the re-radiated signals will also include harmonic frequencies . . . , $f_C-3f_M$, $f_C-2f_M$, $f_C-f_M$, $f_C+f_M$, $f_C+2f$, $f_C+3f_M$, . . . )

Such a modulated scattering technique offers multiple advantages. For example, near fields can be measured with minimum perturbation when small probes are used (e.g., as small as $\lambda/6$), whereas a conventional antenna can introduce perturbation to the transmitting antenna (AUT) characteristics when disposed within its near-field region due to strong coupling between the probes and antenna. Also, when used in an array, design of the resistive pair of wires going to the diodes of each probe (discussed in more detail below) that carry the lower frequency modulated signals ($f_M$) is simpler than designing a conventional switched array receiving antennas with high-frequency combiners and/or multiplexers.

Further, such a modulated scattering technique may be used in at least two ways. For example, in a monostatic mode, a single antenna may be used for both the transmitting signals and receiving the resulting scattered signals. Alternatively, in a bistatic mode, signal transmission and reception of resulting scattered signals may be performed using a different dedicated antenna for each purpose.

Figure 6B:
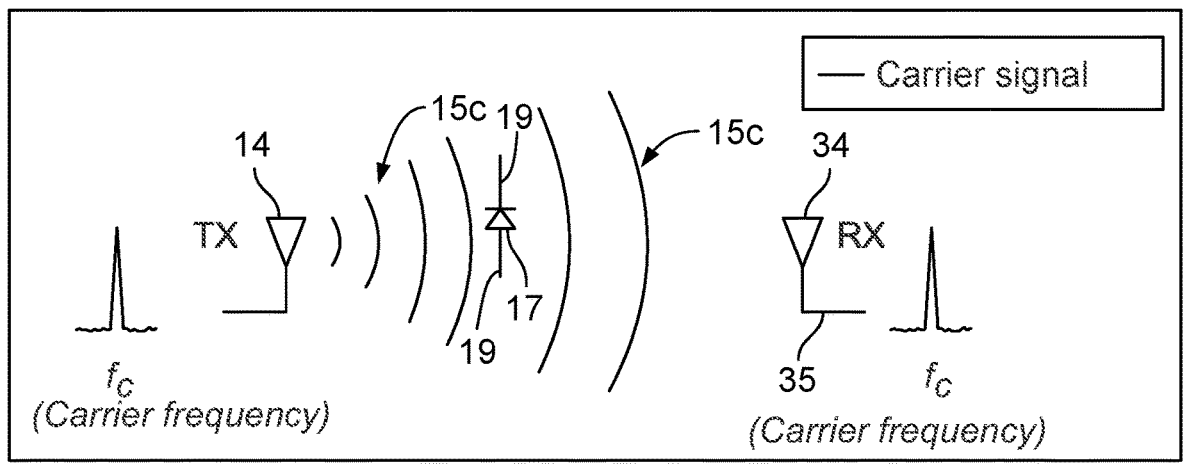
FIG. 6B depicts use of a passive switched probe array during parametric performance testing in accordance with exemplary embodiments.

Referring to FIG. 6B, in accordance with further exemplary embodiments, use of a scattering probe array in passive mode, i.e., with no modulation applied, enables the system to be reused for parametric, or performance, testing over the air. More particularly, the receiving antenna 34, located at a few wavelengths away from the AUT, may be used as the test antenna while the scattering probe array is operated in a passive mode (e.g., with no modulation).

As known in the art, parametric testing focuses on performance parameters (e.g., frequency response flatness, adjacent channel leakage ratio (ACLR), error vector magnitude (EVM), receiver sensitivity, block error rate (BLER), etc.) that are not dependent upon antenna radiated performance. Method as discussed above can be used to perform this testing so long as measurements are repeatable. Testing in a conductive environment (e.g., via RF cable connections) generally provides the most repeatable measurement results. However, conductive testing cannot be used when RF signal ports are unavailable (e.g., devices designed to only operate wirelessly). Hence, over-the-air (OTA) testing is necessary with an additional requirement that measurements be repeatable and the OTA environment through which the signal travels (from transmitter to receiver) has minimal effect(s) upon signal frequency response.

In a modulated-scattering test (MST) system, as discussed above, the probe being modulated is physically small (e.g., no more than $0.25\lambda$ in length) so as to minimize perturbation in performance of the AUT during near-field measurements. However, when the probe array is not modulated, the diodes are off (e.g., effectively appearing as open circuits) and the probe array is effectively operating in a passive mode in which signal re-scattering at the nominal carrier frequency $f_C$ is minimized. Hence, the probe array has minimal effect(s) on measurements about the nominal carrier frequency $f_C$ the RX antenna. More importantly, the probe array remains in a static position and mode, thereby introducing minimal measurement variations during parametric testing.

Figure 7A:
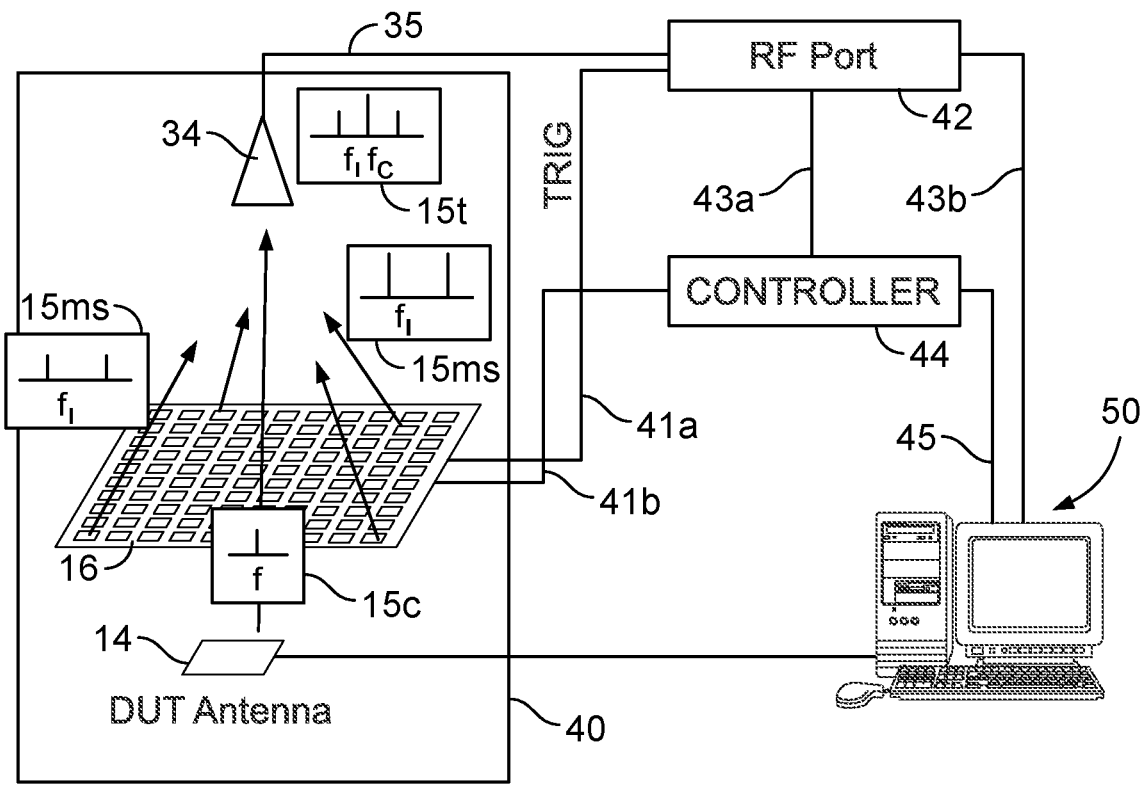
FIG. 7A depicts a testing environment for using an active modulated scattering probe array near-field scanner in accordance with exemplary embodiments.

Referring to FIG. 7A, in accordance with exemplary embodiments as discussed above, a complete test environment may include, without limitation, the AUT 14, probe array 16 and test receiving antenna 34 enclosed in an electromagnetically shielded enclosure 40 with internal signal absorption materials (not shown), in accordance with known techniques, to form an anechoic chamber designed for the signal frequencies being tested. Also included, typically external to the enclosure 40, may be RF signal interface circuitry 42, a controller 44 and PC workstation 50. The controller 44 may provide one or more control signals 41a to the probe array 16 for controlling scanning by the probes (discussed in more detail below), and one or more control signals 43a to the RF signal interface circuitry 42 for controlling capturing of the RF signal 35 for conversion to an appropriate interface signal 43b for the PC workstation. The controller 44 may also communicate with the PC workstation 50, e.g., to provide and/or receive control information and/or data, via one or more signals 45.

Figure 7B:
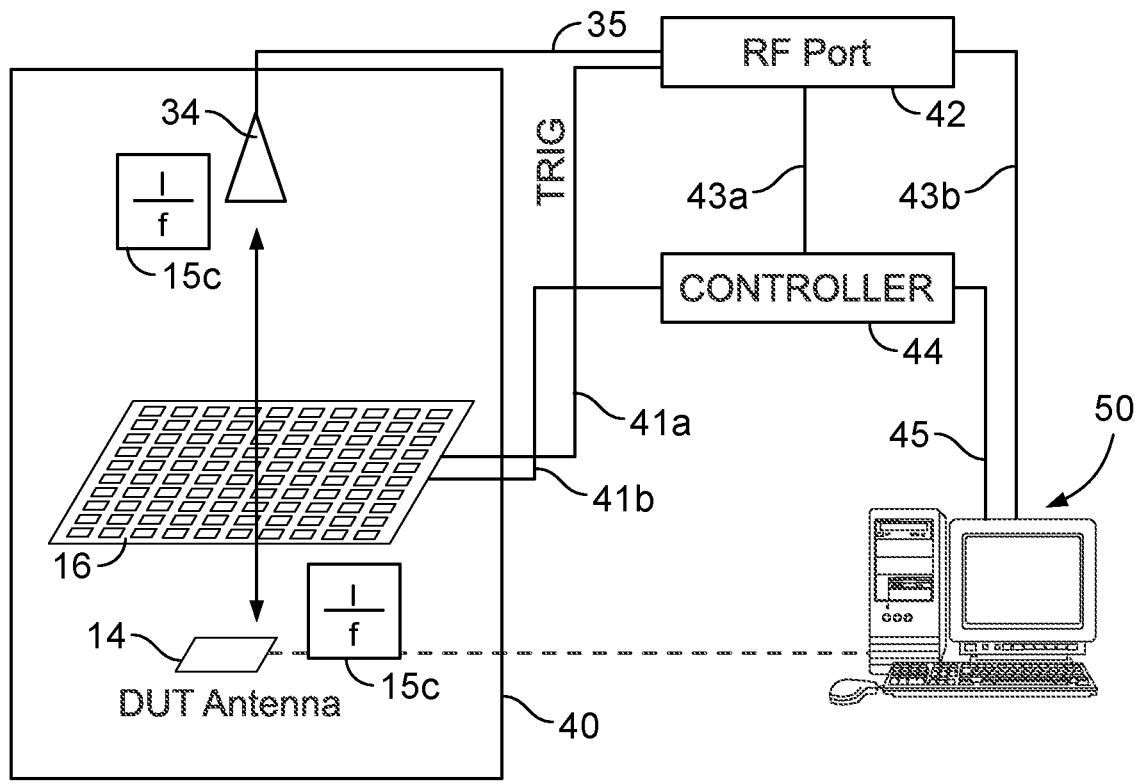
FIG. 7B depicts a testing environment while using a passive scattering probe during parametric performance testing in accordance with exemplary embodiments.

Referring to FIG. 7B, in accordance with further exemplary embodiments as discussed above, during parametric testing the probe array 16 operates in a passive mode in which the probes 17 are effectively open circuits (off) and re-scattering attributable to them is small compared to the signal 15c coming from the AUT. Accordingly, the dominant signal energy arriving at the receiving antenna 34 is attributable to the AUT signal 15c about the nominal carrier frequency $f_C$. During this operating mode, overall path loss can be measured between TX and RX signals, and with proper design of its interior, the enclosure 40 will have minimal effect(s) upon the measurements, thereby ensuring good repeatability of test results. Accordingly, parametric testing can be performed with low degree of uncertainty when using the receiving antenna 34 to receive TX signals from the AUT (TX testing), as well as transmit RX signals to the AUT (RX testing).

Acts, modules, logic and method steps discussed herein may be implemented (e.g., within and/or by the controller 44 and/or PC workstation 50) in various forms, including, without limitation, one or more computer programs or software code stored in one or more forms of tangible machine-readable media (e.g., memory) in communication with a control unit, including without limitation, a processor (e.g., microprocessor, digital signal processor of the like) and memory, which executes code to perform the described behavior(s), function(s), feature(s) and method(s). It will be readily understood by one of ordinary skill in the art that these operations, structural devices, acts, modules, logic and/or method steps may be implemented in software, firmware, special purpose digital logic and/or any combination thereof without deviating from the spirit and scope of the claims.

Referring to FIGS. 8A and 8B, in accordance with exemplary embodiments, a switched probe array may be implemented using one of at least two forms of modulation: electrical or optical. For example, electrical modulation may be applied via resistive wiring 47r, 47c to a PIN diode 17e connected between the associated probe elements 19. While this necessarily introduces metallic elements at or near the measuring probes, which can introduce electromagnetic coupling between the probes of the array, with proper design (discussed in more detail below) such coupling can be minimized. Accordingly, minimal perturbation of the DUT radiated characteristics will be introduced, while also simplifying probe feed switching design and enabling low cost implementations. Alternatively, optical modulation may be applied (e.g., conveyed via optical fiber) via a modulated optical 15mo (e.g., visible or infrared light) or laser 15ml signal to a photo diode 17o connected between the associated probe elements 19. This technique advantageously minimizes use of metallic elements at or near the measuring probes, thereby minimizing potential perturbation of the DUT radiated characteristics. However, an array of numerous modulated probes would require equally numerous optical fibers for which the design and placements and feeding of numerous optically isolated signals may be complex and costly.

With resistive wiring, or traces, the need for two traces for each modulated-scattering (MS) probe results in many traces required in an array. For example, a 30×30 probe array with dual-polarization (to maximize scattered energy) would require 1800 (30×30×2) probes, thereby requiring 3600 (30×30×2×2) traces to be routed within the array. And, in addition to the significant space needed to route so many traces, there is the further need to minimize electromagnetic coupling among the traces that may cause perturbations of the DUT radiated characteristics as well as the scattering effects of the MS probes themselves.

As discussed in more detail below, in accordance with exemplary embodiments, such unwanted coupling effects, costs and design complexity can be reduced. For example, the number of resistive feed traces can be reduced to reduce unwanted coupling effects and design complexities in the routing and switching of the feed traces. A dual-polarized probe array may be designed such that the horizontally-polarized (along the x-dimension) and vertically-polarized (along the y-dimension) probes are placed at the same location (along the z-dimension) so that both signal polarizations are captured at each probe location. Spacings among the probe elements in the array should not be greater than a half wavelength ($\lambda/2$) to avoid unwanted fictitious effects after processing the transforms of the measured values. Therefore, reducing the number of feed traces becomes even more important for operating an array scanner in the extremely high operating frequencies, such as at millimeter-wave frequencies, as inter-element spacing becomes very small making routing of the feed traces becomes very challenging.

Referring to FIG. 9, in accordance with exemplary embodiments, a MS array may be implemented as a matrix configuration of feed traces 47r, 47c to the probes 17 for each polarization (horizontal and vertical) of a nxn element array. During operation of this configuration, a modulation signal 15m is applied to a column trace Ci 47ci (e.g., one of the column traces 47c1, 47c2, . . . , 47cn) and a row trace Rj 47rj (e.g., one of the row traces 47r1, 47r2, . . . , 47rn) is selected for connection to ground so that the modulation signal will only be applied to a single probe (i, j). Hence, only one probe diode 17ij will be driven by the modulation signal 15m while the remaining diodes are maintained in a constant state, e.g., reverse biased by a applying a positive DC voltage +VDD via pull-up resistors 48r to their cathodes and grounding their anodes via pull-down resistors 48c. Accordingly, for a nxn array, instead of requiring 2×n×n feed, or control, lines, only 2n lines are required. For dual polarization probes the required lines becomes 4n (2×2n).

Figure 10:
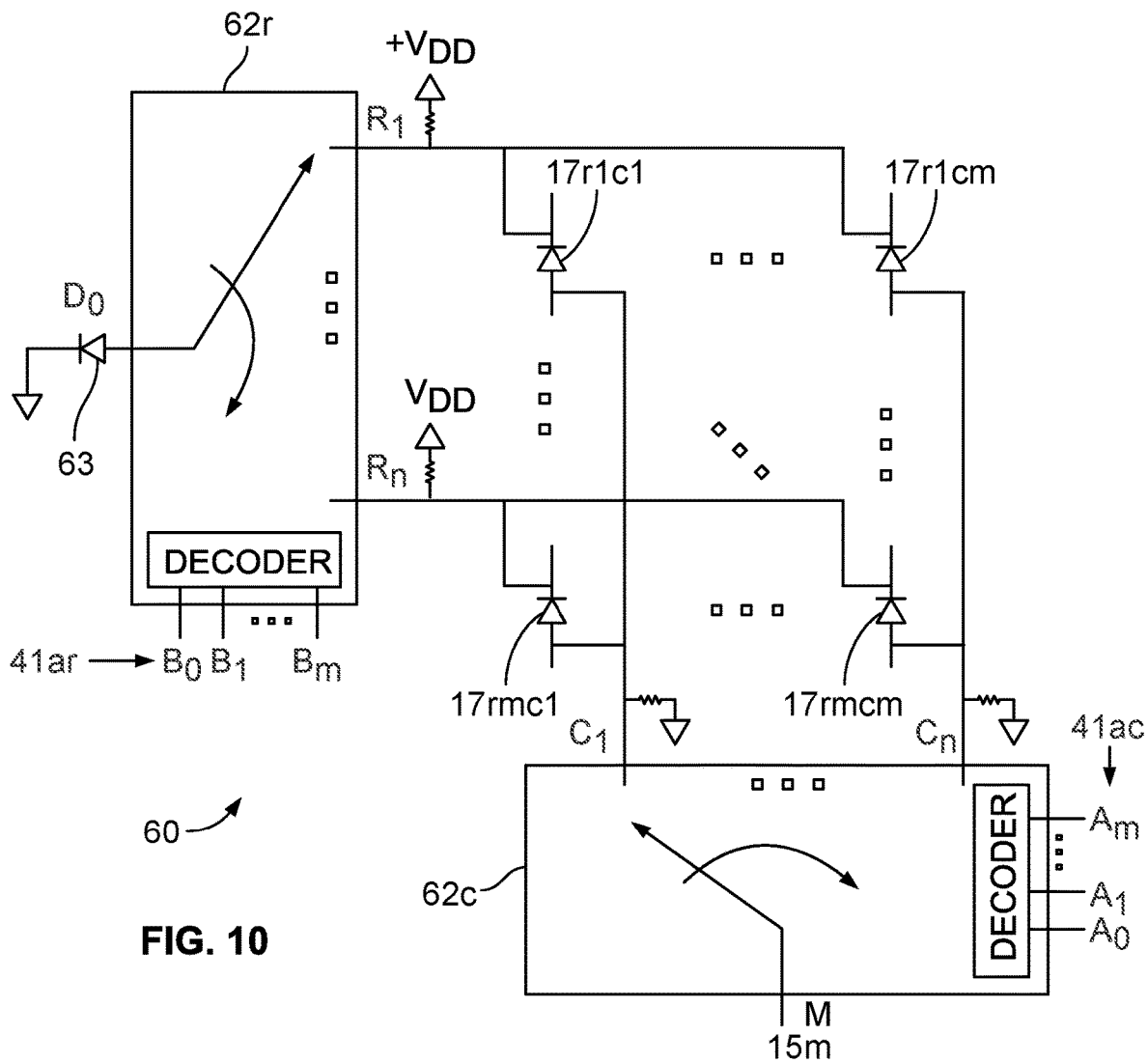
FIG. 10 depicts the matrix of FIG. 9 driven via switching circuitry in accordance with exemplary embodiments.

Referring to FIG. 10, in accordance with exemplary embodiments, the number, complexity and routing of feed traces may be further reduced and/or simplified. For example, two routing circuits or systems 62r, 62c (e.g., in the form of switching circuits or multiplexors) may be used to connect the modulation signal M to a selected column line Ci (e.g., via a column multiplexor 62c) and ground a selected row line Rj (e.g., via a row multiplexor 62r and diode 63). Selection of individual probe diodes 17rjci by the multiplexors 62c, 62r may be initiated by respective sets of multiplex control signals A0, A1, . . . , Am, B0, B1, . . . , Bm. Accordingly, the number of control lines becomes reduced to 2m+1, where m is smallest integer that is greater than log 2(n): A0, A1, . . . , Am, B0, B1, . . . , Bm, and M. For example, a 30×30 probe array will require only 11 (2×5+1) control lines. Adding dual polarization to this proposed configuration will only increase the number of lines by one, since the multiplex control signals A0, A1, . . . , Am, B0, B1, . . . , Bm may be reused for the second polarization. Then, only one additional line will be needed for directing the modulation signal M to the vertical probe polarization array (as the vertical probe polarization modulation signal MV) or the horizontal probe polarization array (as the horizontal probe polarization modulation signal MH). Hence, this may ensure that only the selected probe diode 17$rjci$ of the selected polarization array (vertical or horizontal) is modulated while the remaining probe diodes are held in reversed-bias states.

Figure 11:
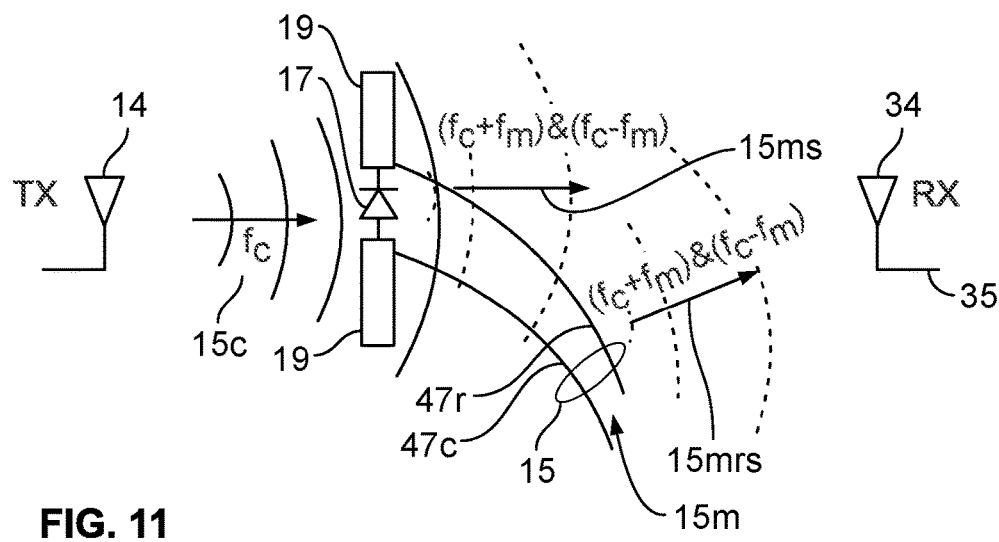
FIG. 11 depicts generation of scattered and re-scattered modulated scattering signals due to adverse probe radiation characteristics.

Referring to FIG. 11, it is important that the design and layout of the MS array 16 ensure that among all the scattering elements 19 within the array 16 (the probes that re-radiate energy received from the AUT 14) the only active element radiating energy is the selected diode 17 being modulated. Any other metallic element, wire or trace connected to the probe element 17, such as the control lines 47$r$, 47$c$, will not only affect probe radiation characteristics but may also experience modulation effects from the diode 17. A potential adverse effect is re-scattering by the control lines 47$r$, 47$c$ of electromagnetic energy 15$mrs$ at the modulation sideband frequencies fc+fm, fc−fm. This may introduce errors to measurements since the control lines 47$r$, 47$c$ may not only capture and re-scatter near-fields that are not located at the specified probe 19, but also degrade polarization discrimination between the horizontal and vertical probes as well as coupling between adjacent probes.

Figure 12:
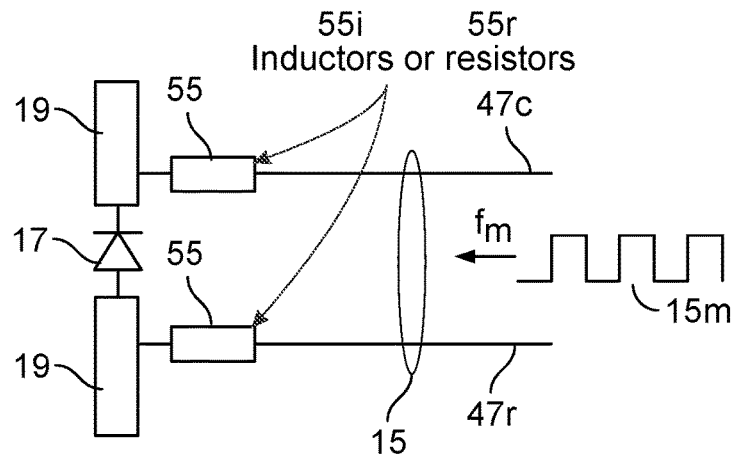
FIG. 12 depicts possible uses of inductive or resistive circuit elements for decoupling probes of a modulated scattering probe array from incoming modulation signals.

Referring to FIG. 12, decoupling the control lines 15 can be done by including resistors or inductors 55 to increase resistance or impedance at the measuring frequency at the connection points 19 to be decoupled. Increasing resistance or impedance reduces current flow. Inductive impedance response is a function of frequency and may be designed to exhibit high impedance characteristics at certain microwave frequencies and low impedance at low frequencies. However, while inductors may be suitable for decoupling components at microwave frequencies, inductor design at higher frequencies (e.g., millimeter-wave frequencies of tens of GHz and higher), becomes more complex and may not give a useful and/or consistent impedance response for decoupling purpose in that frequency range. Accordingly, using resistors to increase resistance as the decoupling components at such higher frequencies may often be preferred, since their resistances ideally remain substantially constant over wide frequency ranges. In any event, it is important that the modulation signal voltage is sufficiently high enough to ensure that the diode 17 operates in its forward bias region.

Figure 13:
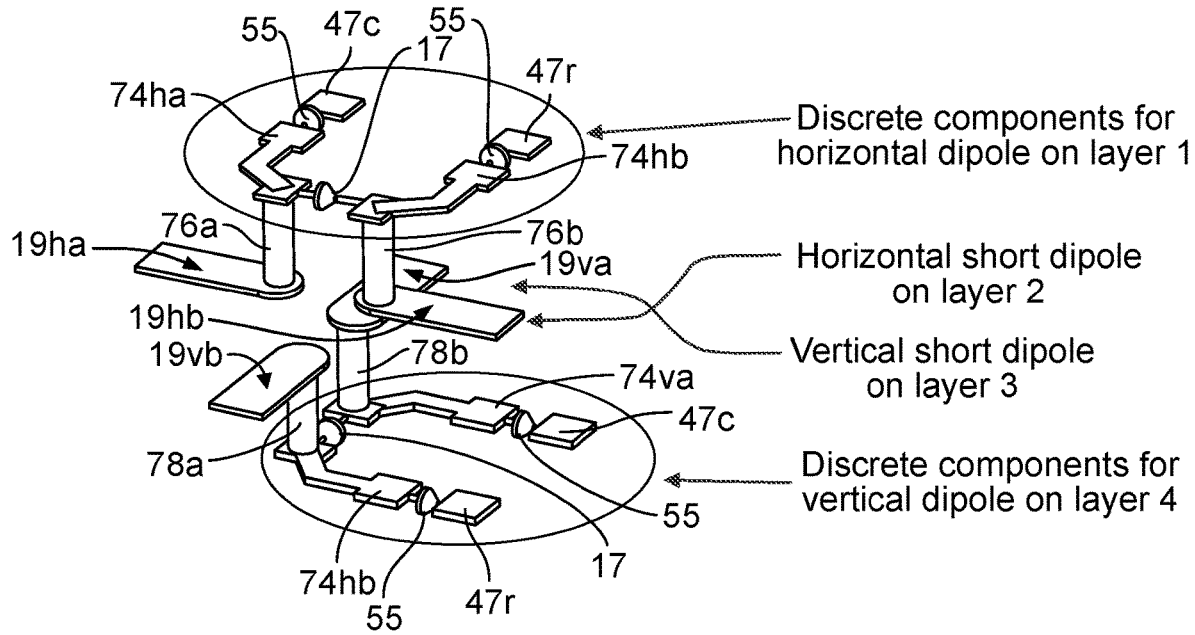
FIG. 13 depicts a multi-layer substrate structure for a modulated scattering probe array in accordance with exemplary embodiments.

Referring to FIG. 13, as noted above, capturing the maximum amount of energy radiated from an antenna requires complex signal measurements in two orthogonal linear polarizations (e.g., "horizontal" and "vertical" relative to one another). To implement such a dual-polarized probe array, each probe element will need two linear polarizations. A simple design includes two short dipoles oriented orthogonally to each other. Other designs may also be used so as long as polarization discrimination between two probes is good and coupling between neighboring probes in an array is minimal. Preferably the radiated signals should be captured at the same planar location for each pair of orthogonal dipoles, or at least relatively close (electrically) to each other. As depicted here, a design having a layout supported by multiple layers of a support structure (e.g., a four-layer printed circuit board, discussed in more detail below) may satisfy such a dipole location requirement and be suitable for managing the control line routing of all elements of the resulting planar array.

For example, first and second layers may support elements for a horizontal dipole and its control lines. More particularly, the first layer supports column 47$c$ and row 47$r$ control lines that feed the modulation signal, via decoupling elements 55 and feed lines 74$ha$, 74$hb$ to the associated modulation device 17. The horizontal dipole elements 19$ha$, 19$hb$ are supported by the second layer, and receive and transform radiated energy (from the AUT) to a RF electrical signal that is conveyed by plated through-holes (vias) 76$a$, 76$b$ to the modulation device 17. The resulting modulated RF signal is re-conveyed by the vias 76$a$, 76$b$ back to the dipole elements 19$ha$, 19$hb$ that, in turn, transform it to an electromagnetic signal to be radiated as a corresponding scattered signal having horizontal polarization.

Similarly, third and fourth layers may support elements for a vertical dipole and its control lines. More particularly, the fourth layer supports column 47$c$ and row 47$r$ control lines that feed the modulation signal, via decoupling elements 55 and feed lines 74$va$, 74$vb$ to the associated modulation device 17. The vertical dipole elements 19$va$, 19$vb$ are supported by the third layer, and receive and transform radiated energy (from the AUT) to a RF electrical signal that is conveyed by plated through-holes (vias) 78$a$, 78$b$ to the modulation device 17. The resulting modulated RF signal is re-conveyed by the vias 78$a$, 78$b$ back to the dipole elements 19$va$, 19$vb$ that, in turn, transform it to an electromagnetic signal to be radiated as a corresponding scattered signal having vertical polarization.

Figure 14:
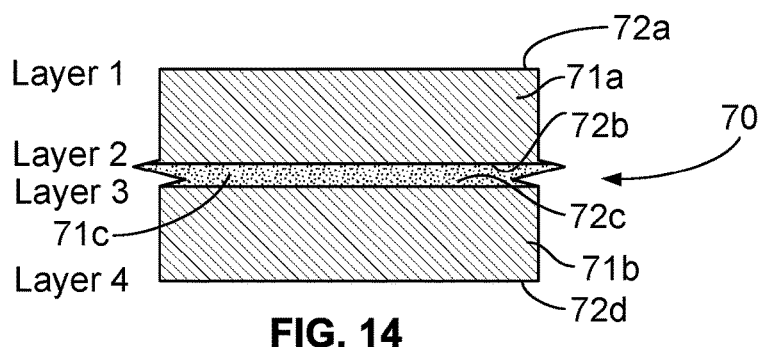
FIG. 14 depicts relative horizontal and vertical positioning of orthogonal probes within a multi-layer modulated scattering probe array in accordance with exemplary embodiments.

Referring to FIG. 14, in accordance with exemplary embodiments as noted above, the support structure for the probe array may be a four-layer printed circuit board (PCB) 70. In accordance with techniques known in the art, such a PCB 70 may include four layers 72$a$, 72$b$, 72$c$, 72$d$ of patterned electrical conductors separated and mutually electrically isolated by three layers 71$a$, 71$b$, 71$c$ of electrically insulating material (e.g., dielectrics). Preferably, the gap filled by the middle insulating layer 71$c$ between the middle opposing conductive layers 72$b$, 72$c$ (layers 2 and 3) may be electrically small (i.e., based upon its dielectric constant, its physical thickness corresponds to a fraction of a wavelength of the nominal frequency of the radiated energy to be received and scattered). Alternatively, a two-layer PCB design may also be used, in which case the horizontal dipole elements 19$ha$, 19$hb$ and their associated decoupling elements 55, feed lines 74$ha$, 74$hb$ and modulation device 17 are on a shared first layer, and the vertical dipole elements 19$va$, 19$vb$ and their associated decoupling elements 55, feed lines 74$va$, 74$vb$ and modulation device 17 are on a shared second layer. Further, preferably, the PCB may be a rigid board with a minimum thickness of 1-1.5 mm. Accordingly, a two-layer PCB may perform well for microwave frequencies as the gap (board thickness) between the two short dipoles is electrically small, though within the millimeter wave frequency region, a four-layer board design may be more suitable.

Figure 15A:
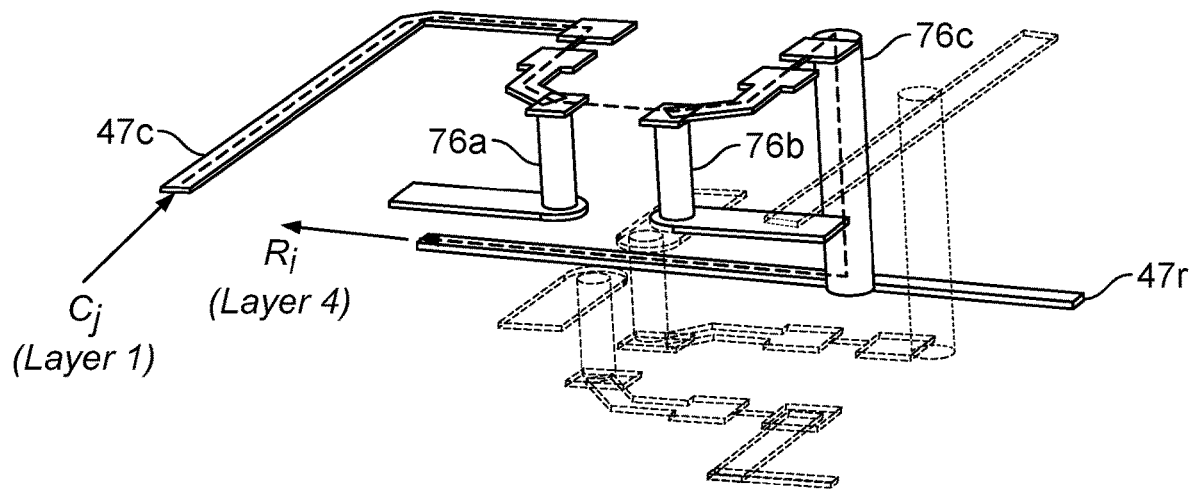
FIGS. 15A and 15B depict modulated signal paths for orthogonal probes within a multi-layer modulated scattering probe array in accordance with exemplary embodiments.
Figure 15B:
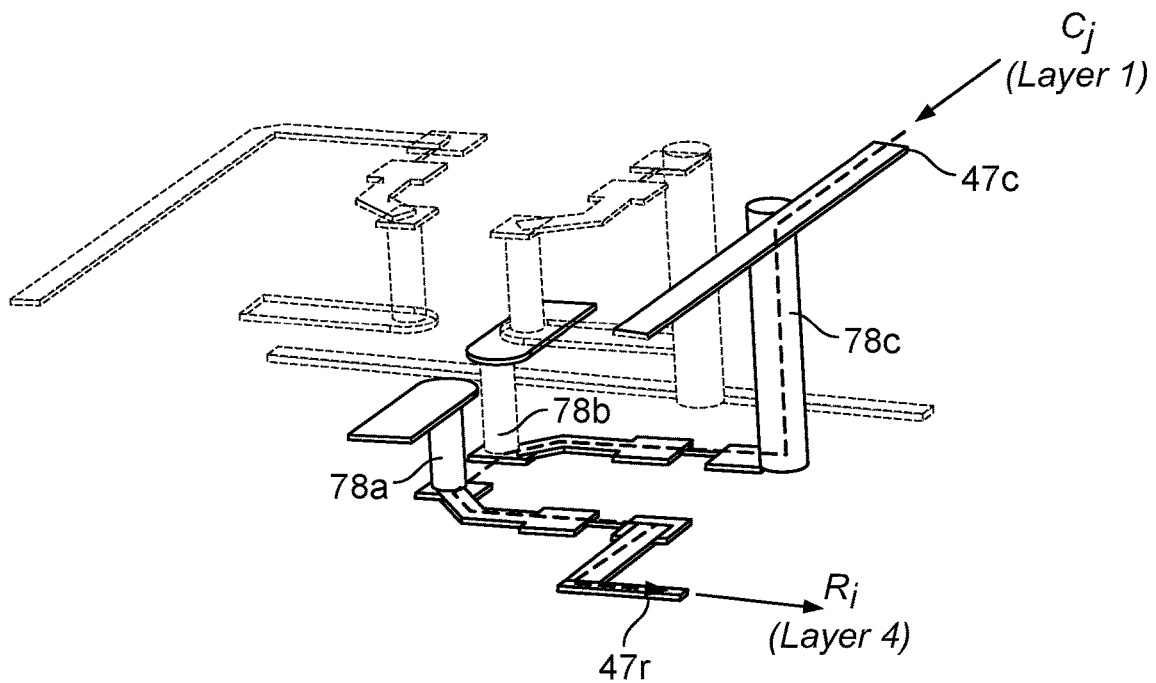

Referring to FIGS. 15A and 15B, as discussed above, selection of an active probe is achieved by selecting a row i and a column j as in a matrix configuration. To avoid feed and/or control traces needing to somehow cross each other, trace routing makes use of multiple (e.g., two) PCB layers to accomplish the necessary routing. Feed and/or control traces where the signal enters may be on one layer, parallel to each other, while associated return traces may be on the other layer and parallel to each other, but orthogonal to the feed and/or control traces. For example, the modulation signal for a horizontal probe may be introduced via a column control line 47*c* on layer 1, and returned through another via 76*c* to a row control line 47*r* on layer 4. Similarly, the modulation signal for a vertical probe may be introduced via a column control line 47*c* on layer 1 and through another via 78*c*, and returned via a row control line 47*r* on layer 4.

With so many individual components required to implement a scattered probe array, as discussed above, it would be significantly advantageous to be able to monitor and/or periodically test the operation of each probe (along with its associated elements). In accordance with exemplary embodiments, this can be achieved by appropriate implementation of the circuitry controlling the array. For example, following manufacture of the array, proper operation of each probe assembly can be tested. If a defect is encountered, the defective probe assembly may be reworked to make any necessary repairs (e.g., replace a damaged diode and/or decoupling device, etc.). An incomplete set of measured data points may also be processed using an interpolation algorithm, such as compressed sensing algorithm, to recover missing data points. Knowing which data points are missing, or which probes are not working properly, and using a data point recovery algorithm to recover missing data points may be expected to enable better measurements than handling data points that have incorrect values because of unknown defects.

Figure 16:
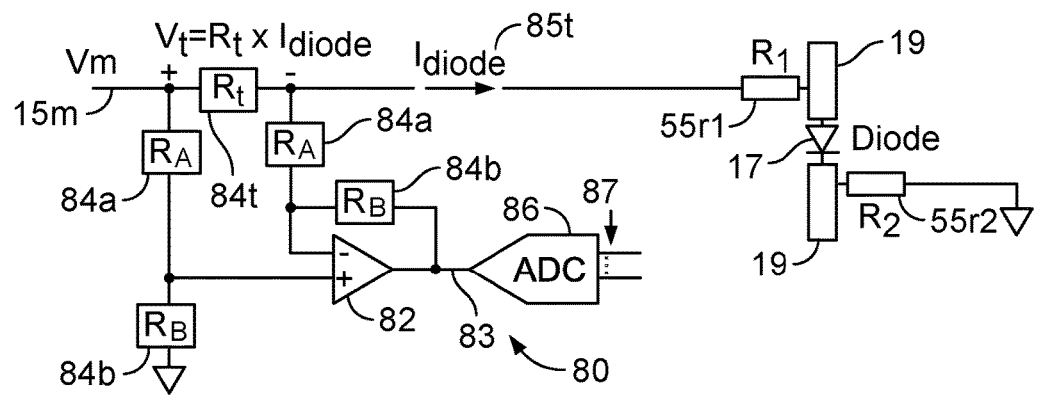
FIG. 16 depicts test circuitry for monitoring performance of probes within a multi-layer modulated scattering probe array in accordance with exemplary embodiments.

Referring to FIG. 16, in accordance with exemplary embodiments, test circuitry 80 for testing operation of each probe assembly may be implemented with an operational amplifier 82, multiple resistances 84 and analog-to-digital (ADC) circuitry 86, interconnected substantially as shown. In accordance with known principles, the operational amplifier 82 and resistances 84*a*, 84*b* forming voltage dividers at its inverting and non-inverting input terminals operate to measure the voltage across a series resistance 84*t* through which probe diode 17 current 85*t* flows. Based upon the known value of the series resistance 84*t*, the measured voltage 83 signal represents the diode 17 current and may be converted to a corresponding digital signal 87 by the ADC circuitry 86. The most likely types of errors include an open circuit for a specific diode (e.g., a component is not properly soldered to the PCB and not making contact), a diode is shorted, or a bias resistor is shorted. In the first instance, the measured current 85*t* when the diode is selected will be lower than the nominal current, and in the second instance, the measured current 85*t* will be higher than the nominal current.

Figure 17:
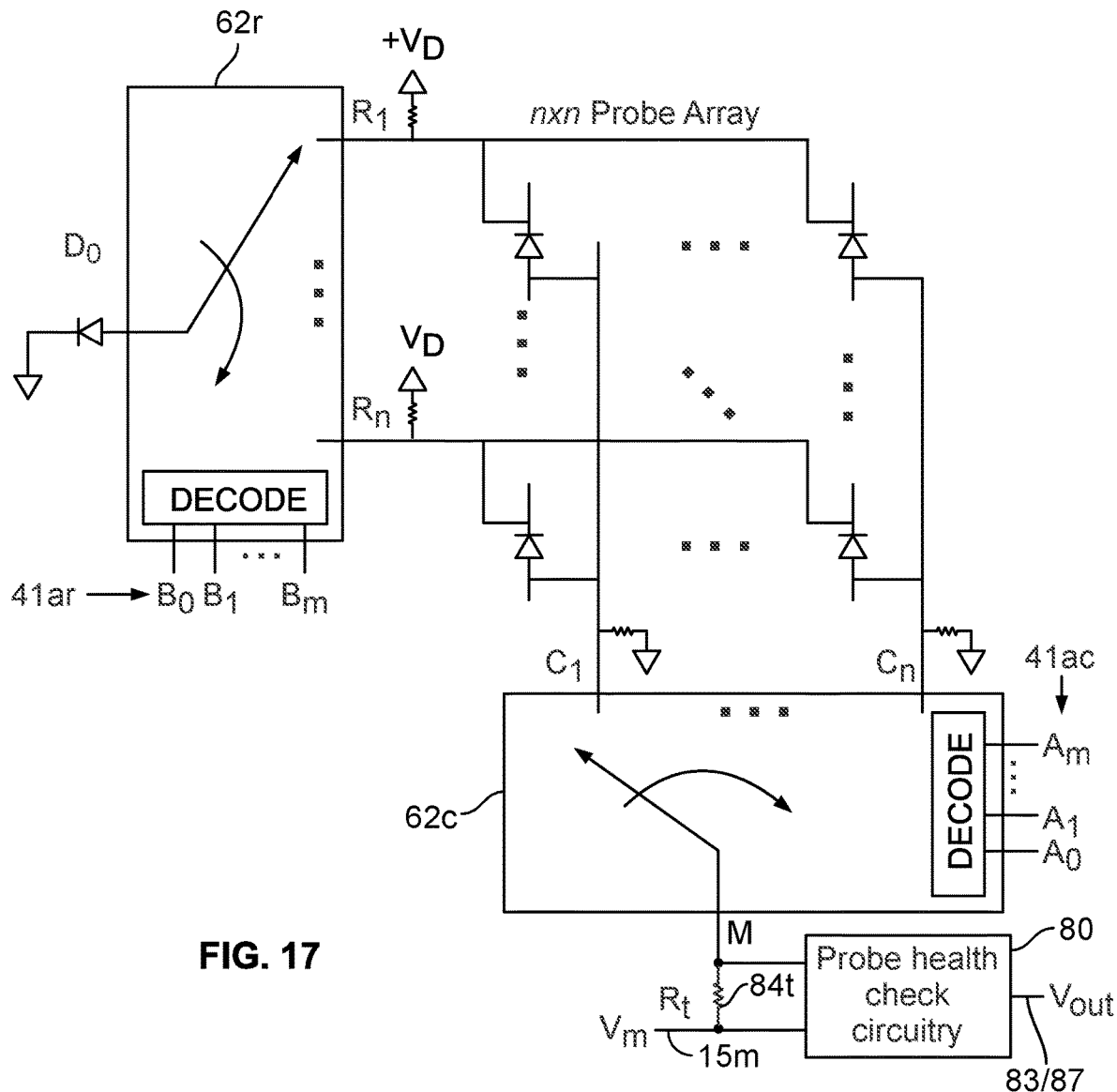
FIG. 17 depicts a matrix for providing electrical driving signals via switching circuitry for modulation devices of a modulated scattering probe array near-field scanner with test circuitry for monitoring performance of the probes in accordance with exemplary embodiments.

Referring to FIG. 17, the probe test circuitry 80 may be connected via a common point of the feed circuitry for each polarization at the point M where the modulation signal Vm 15*m* is applied. During probe testing, this voltage Vm may be fixed at a constant voltage that is sufficiently high to ensure that the diode 17 being tested is in a state of forward bias. Individual probe diodes 17 may be individually and sequentially tested by measuring the current 85*t* through each diode 17 as they are individually selected. The current through each diode 17 may be determined by measuring the voltage drop Vt across the resistor 84*t* in series with the feed trace and decoupling devices 55*r*1, 55*r*2 and diode 17. Alternatively, multiple probes may be tested simultaneously by scanning all probes or subsets of multiple probes (e.g., full rows or columns of probes) using different respective modulation frequencies to drive the scanned probes.

Various other modifications and alternatives in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an active modulated scattering probe array, comprising:
   a circuit board structure having a plurality of layers, wherein said plurality of layers include alternating planar layers of electrical conductors and at least one dielectric;
   a first plurality of probe antenna elements disposed with a first common orientation in a first array in a first one of said plurality of layers;
   a first plurality of electrical signal modulation devices connected among said first plurality of probe antenna elements and disposed in a second one of said plurality of layers; and
   a first plurality of electrical impedances connected among said first plurality of electrical signal modulation devices and disposed in said second one of said plurality of layers;
   a second plurality of probe antenna elements disposed with a second common orientation in a second array in a third one of said plurality of layers;
   a second plurality of electrical signal modulation devices connected among said second plurality of probe antenna elements and disposed in a fourth one of said plurality of layers; and
   a second plurality of electrical impedances connected among said second plurality of electrical signal modulation devices and disposed in said fourth one of said plurality of layers.

2. The apparatus of claim 1, wherein said first plurality of probe antenna elements comprises a plurality of microstrip traces.

3. The apparatus of claim 1, wherein said first plurality of electrical signal modulation devices comprises a plurality of diodes.

4. The apparatus of claim 1, wherein said first plurality of electrical impedances comprises plurality of resistances.

5. The apparatus of claim 1, wherein said first plurality of electrical signal modulation devices are connected among said first plurality of probe antenna elements with a plurality of electrically conductive vias.

6. The apparatus of claim 1, further comprising current measurement circuitry connected to said first plurality of electrical signal modulation devices and configured to measure a plurality of respective currents conducted through each one of said first plurality of electrical signal modulation devices.

7. The apparatus of claim 1, wherein said first and second common orientations are mutually orthogonal.

8. The apparatus of claim 1, wherein said first and second arrays are mutually disposed such that respective ones of said second plurality of probe antenna elements are disposed in locations that are mutually proximate to respective ones of said first plurality of probe antenna elements.

9. A method for operating an active modulated scattering probe array, comprising: providing a circuit board structure having a plurality of layers, wherein said plurality of layers include alternating planar layers of electrical conductors and at least one dielectric;

providing a first plurality of probe antenna elements disposed with a first common orientation in a first array in a first one of said plurality of layers;

providing a first plurality of electrical signal modulation devices disposed in a second one of said plurality of layers and connected among said first plurality of probe antenna elements; and providing a first plurality of electrical impedances disposed in said second one of said plurality of layers and connected among said first plurality of electrical signal modulation devices;

providing a second plurality of probe antenna elements disposed with a second common orientation in a second array in a third one of said plurality of layers;

providing a second plurality of electrical signal modulation devices disposed in a fourth one of said plurality of layers and connected among said second plurality of probe antenna elements; and providing a second plurality of electrical impedances disposed in said fourth one of said plurality of layer and connected among said second plurality of electrical signal modulation devices.

10. The method of claim 9, wherein said first plurality of probe antenna elements comprises a plurality of microstrip traces.

11. The method of claim 9, wherein said first plurality of electrical signal modulation devices comprises a plurality of diodes.

12. The method of claim 9, wherein said first plurality of electrical impedances comprises plurality of resistances.

13. The method of claim 9, wherein said first plurality of electrical signal modulation devices are connected among said first plurality of probe antenna elements with a plurality of electrically conductive vias.

14. The method of claim 9, further comprising measuring a plurality of respective currents conducted through each one of said first plurality of electrical signal modulation devices.

15. The method of claim 9, wherein said first and second common orientations are mutually orthogonal.

16. The method of claim 9, wherein said first and second arrays are mutually disposed such that respective ones of said second plurality of probe antenna elements are disposed in locations that are mutually proximate to respective ones of said first plurality of probe antenna elements.

* * * * *